(12) United States Patent
Hirota et al.

(10) Patent No.: US 7,755,167 B2
(45) Date of Patent: Jul. 13, 2010

(54) SEMICONDUCTOR DEVICE INCLUDING SWITCHING ELEMENT AND TWO DIODES

(75) Inventors: Yoshihiko Hirota, Chiyoda-ku (JP); Chihiro Tadokoro, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/776,913

(22) Filed: Jul. 12, 2007

(65) Prior Publication Data

US 2008/0179704 A1 Jul. 31, 2008

(30) Foreign Application Priority Data

Jan. 29, 2007 (JP) .............................. 2007-017913

(51) Int. Cl.
*H01L 27/06* (2006.01)
(52) U.S. Cl. ....................... 257/577; 257/552; 257/362; 257/E27.019
(58) Field of Classification Search ................. 257/362, 257/552, 577, E27.019
See application file for complete search history.

(56) References Cited

U.S. PATENT DOCUMENTS

| | | | |
|---|---|---|---|
| 5,045,900 A | | 9/1991 | Tamagawa |
| 5,608,595 A | | 3/1997 | Gourab et al. |
| 7,019,338 B1 | * | 3/2006 | Ballon ........................ 257/173 |
| 7,154,145 B2 | * | 12/2006 | Takahashi ................... 257/328 |
| 2003/0116773 A1 | * | 6/2003 | Kraus et al. .................... 257/88 |
| 2005/0023673 A1 | | 2/2005 | Nowak |
| 2006/0226439 A1 | * | 10/2006 | Robb et al. .................. 257/119 |
| 2007/0069287 A1 | * | 3/2007 | Takahashi ................... 257/330 |
| 2007/0170549 A1 | * | 7/2007 | Tsuzuki et al. .............. 257/565 |
| 2007/0194346 A1 | * | 8/2007 | Nagase et al. ............... 257/146 |
| 2008/0258172 A1 | * | 10/2008 | Takahashi et al. ........... 257/139 |

FOREIGN PATENT DOCUMENTS

| | | | | |
|---|---|---|---|---|
| CN | 1524298 A | | 8/2004 | |
| JP | 62-210858 | | 9/1987 | |
| JP | 7-297358 | | 11/1995 | |
| JP | 2001-111398 | * | 4/2001 | .................... 17/16 |
| JP | 2002-314082 A | | 10/2002 | |
| JP | 2003-33044 | | 1/2003 | |
| JP | 2005-45261 | | 2/2005 | |
| JP | 2005-328668 | | 11/2005 | |
| WO | WO 02/095836 A1 | | 11/2002 | |

OTHER PUBLICATIONS

Akemi Sano, et al., "Current-Source Inverter for Induction Heating Using IGBT", Denko Giho, No. 28, 1994, 8 Pages (with Partial English Translation).
Katsumi Nishida, et al., "Novel Current Control Scheme with Deadbeat Algorithm and Adaptive Line Enhancer for Three-Phase Current-Source Active Power Filter", IEEE Industry Applications Conference, 36th Annual Meeting, Sep. 30-Oct. 4, 2001, 9 Pages.

* cited by examiner

*Primary Examiner*—Victor A Mandala
(74) *Attorney, Agent, or Firm*—Oblon, Spivak, McClelland, Maier & Neustadt, L.L.P.

(57) ABSTRACT

A semiconductor device includes a transistor, a first diode, and a second diode. A collector of the transistor and a cathode of the first diode are electrically connected. The collector of the transistor and a cathode of the second diode are electrically connected, and an emitter of the transistor and an anode of the second diode are electrically connected. The first diode and the second diode are formed in an identical substrate. Thereby, the semiconductor device can be produced in a smaller size and in less steps.

15 Claims, 5 Drawing Sheets

SEMICONDUCTOR DEVICE INCLUDING SWITCHING ELEMENT AND TWO DIODES

BACKGROUND OF THE INVENTION

1. Field of the Invention

The present invention relates to a semiconductor device, and more particularly to a semiconductor device including a switching element of a current-source inverter and two diodes provided for preventing destruction of the switching element.

2. Description of the Background Art

Inverters have a function of converting direct current power into alternating current power, and a function of converting an amplitude, a frequency, or a phase of alternating current power. They are used in various applications such as motor control, a power supply unit, and a ballast for a discharge lamp. Inverters include a voltage-source inverter operating as a voltage source, and a current-source inverter operating as a current source.

Referring to FIG. 14, a current-source inverter 100 has an alternating current power source AC, switching elements SW1-SW4, and a load L. Switching elements SW1 and SW2 are connected in series, and switching elements SW3 and SW4 are connected in series. A set of switching elements SW1 and SW2 and a set of switching elements SW3 and SW4 are connected in parallel with respect to the alternating current power source. Load L is located to connect a point between switching elements SW1 and SW2 and a point between switching elements SW3 and SW4. In current-source inverter 100, alternating current power from alternating current power source AC is appropriately converted and applied to load L by controlling turning ON/OFF of each of switching elements SW1-SW4.

As switching elements SW1-SW4 of current-source inverter 100, a transistor such as an IGBT (Insulated Gate Bipolar Transistor), a bipolar transistor, or a field effect transistor may be used. When a reverse voltage (a voltage causing a collector potential to be higher than an emitter potential) is applied to a transistor, the transistor may be destroyed. Accordingly, to prevent the reverse voltage from being applied to switching elements SW1-SW4, a reverse blocking diode is connected in series with respect to a switching element. The reverse blocking diode has a cathode connected to a collector of the switching element, or an anode connected to an emitter of the switching element.

Further, when the reverse voltage is blocked by the reverse blocking diode, a reverse current (recovery current) may instantaneously flow into the switching element, and the switching element may be destroyed by a reverse voltage generated by the recovery current. Accordingly, to prevent the recovery current from flowing into switching elements SW1-SW4, a recovery current protection diode is connected in parallel with respect to a switching element. The recovery current protection diode has a cathode connected to a collector of the switching element, and an anode connected to an emitter of the switching element. Thereby, the recovery current flows toward the recovery current protection diode instead of flowing into the switching element.

Japanese Patent Laying-Open No. 62-210858 discloses a technique in which a pair of a reverse blocking diode and a circulation diode is packaged. Further, a circuit structure of a conventional inverter is disclosed in Akemi Sano et al., "Current-Source Inverter for Induction Heating Using IGBT", Denko Giho, No. 28, 1994, pp. 54-59, and K. Nishida et al., "NOVEL CURRENT CONTROL SCHEME WITH DEAD-BEAT ALGORITHM AND ADAPTIVE LINE ENHANCER FOR THREE-PHASE CURRENT-SOURCE ACTIVE POWER FILTER", IEEE Industry Applications Conference 36th Annual Meeting, 2001.

In current-source inverter 100, a reverse blocking diode and a recovery current protection diode are connected to each of switching elements SW1-SW4 as described above. Therefore, a module of current-source inverter 100 requires a space for disposing a semiconductor chip having a reverse blocking diode formed therein and a space for disposing a semiconductor chip having a recovery current protection diode formed therein, which has caused a problem that the module of current-source inverter 100 has a large size. Further, producing the module of current-source inverter 100 requires a step of producing a reverse blocking diode and a step of producing a recovery current protection diode, which has caused a problem that the number of production steps is increased.

These problems are not limited to the module of current-source inverter 100, and may arise in overall semiconductor devices having a structure that a reverse blocking diode and a recovery current protection diode are connected to a switching element.

SUMMARY OF THE INVENTION

One object of the present invention is to provide a semiconductor device capable of being produced in a smaller size and in less steps.

A semiconductor device of the present invention includes a switching element, a first diode, and a second diode. A collector of the switching element and a cathode of the first diode are electrically connected, or an emitter of the switching element and an anode of the first diode are electrically connected. The collector of the switching element and a cathode of the second diode are electrically connected, and the emitter of the switching element and an anode of the second diode are electrically connected. The first diode and the second diode are formed in an identical substrate.

According to the semiconductor device of the present invention, since the first diode and the second diode are formed in the identical substrate, the number of substrates can be reduced compared to the case where the first diode and the second diode are formed in separate substrates. Consequently, space occupied by the substrate can be reduced, and thus the semiconductor device can be produced in a smaller size. Further, two diodes can be produced at one time, and thus the semiconductor device can be produced in less steps.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

First Embodiment

Figure 1:
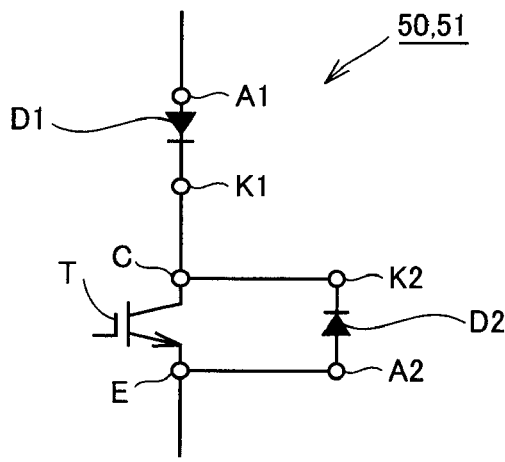
FIG. 1 is a circuit diagram of a semiconductor device in a first embodiment of the present invention.
Figure 14:
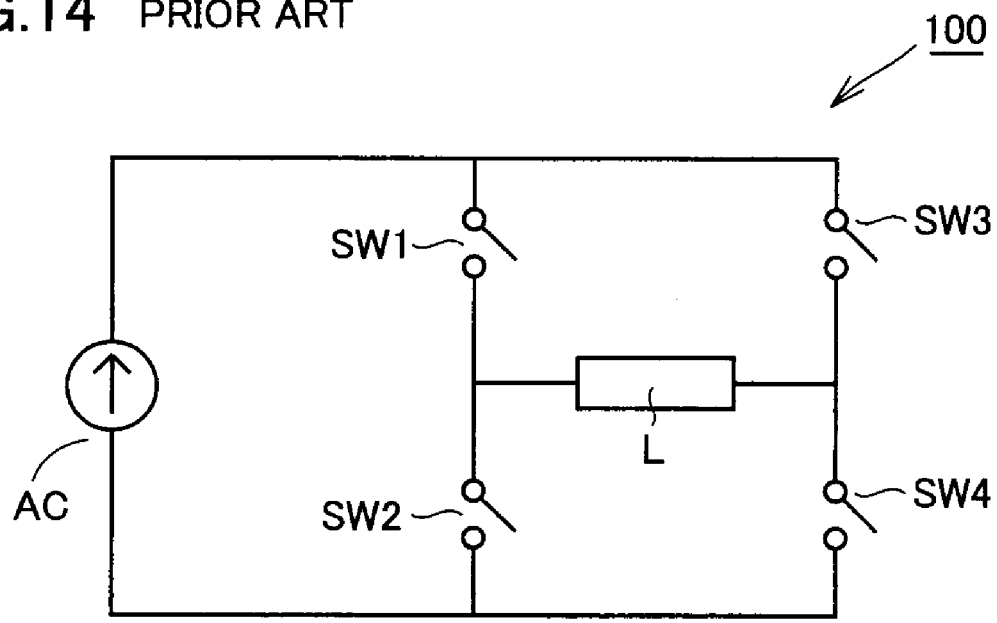
FIG. 14 is a view schematically showing a circuit structure of a current-source inverter.

Referring to FIG. 1, a semiconductor device 50 in the present embodiment is a semiconductor device used for example as each of switching elements SW1-SW4 of current-source inverter 100 shown in FIG. 14, including a transistor T as a switching element, a diode D1 as a first diode, and a diode D2 as a second diode. In the drawing diode D1 is located above transistor T, and diode D2 is located on the right side of transistor T. Diode D1 has an anode A1 and a cathode K1, and cathode K1 is electrically connected to a collector C of transistor T. Diode D2 has an anode A2 and a cathode K2, and anode A2 is electrically connected to an emitter E of transistor T and cathode K2 is electrically connected to collector C of transistor T. For example, an IGBT, a bipolar transistor, a field effect transistor, or the like is used as transistor T.

Figure 2:
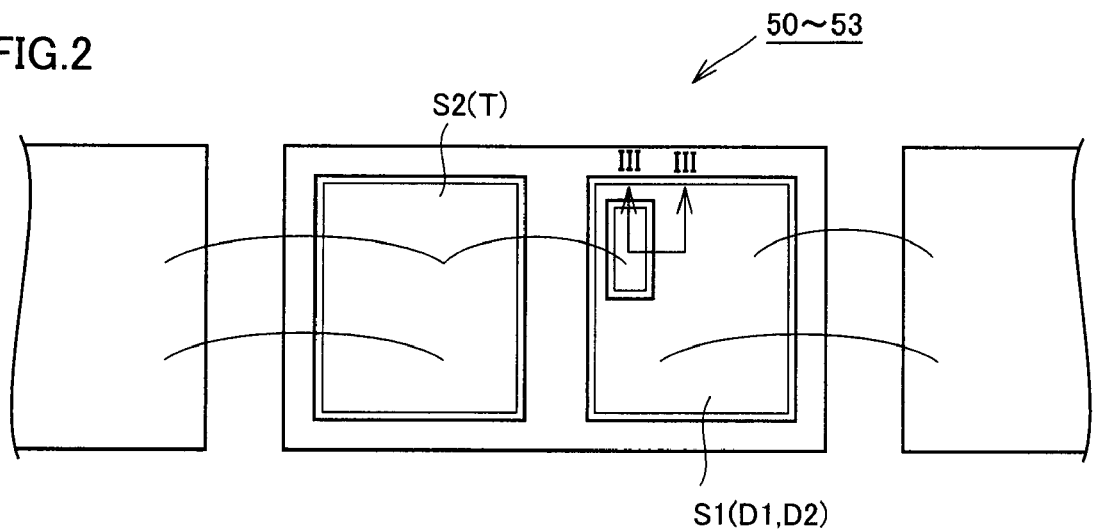
FIG. 2 is a top view showing a structure of the semiconductor device in the first embodiment of the present invention.

Referring to FIGS. 1 and 2, semiconductor device 50 includes two substrates S1 and S2. Diodes D1 and D2 are formed in identical substrate S1, and transistor T is formed in substrate S2. Substrates S1 and S2 are electrically connected with each other for example by wire bonding. Semiconductor device 50 may be electrically connected with another module such as an alternating current power source, and substrates S1 and S2 may be an identical substrate.

Figure 3:
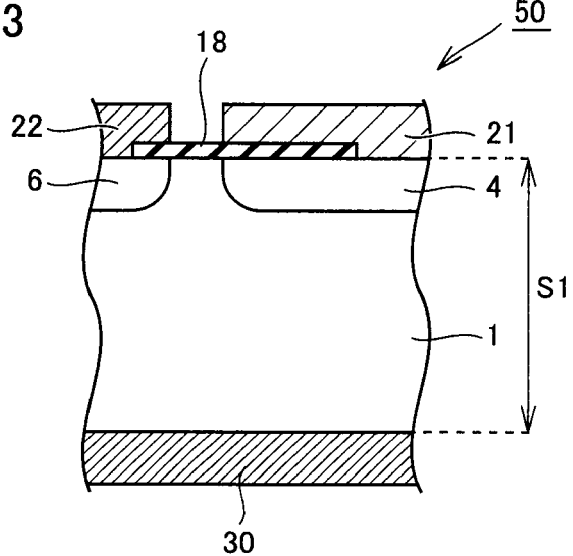
FIG. 3 is a cross sectional view taken along a line III-III in FIG. 2.

Referring to FIG. 3, semiconductor device 50 has an n-type impurity region 1 (one impurity region), p-type impurity regions 4 and 6, conductive layers 21 and 22, a conductive layer 30, and an insulating layer 18. N-type impurity region 1 is formed within substrate S1, and p-type impurity regions 4 and 6 are formed within n-type impurity region 1 in an upper surface of substrate S1. P-type impurity regions 4 and 6 are separated from each other with only n-type impurity region 1 interposed therebetween. Insulating layer 18 is formed on the upper surface of substrate S1, and conductive layers 21 and 22 are formed to cover a portion of insulating layer 18. Conductive layers 21 and 22 are separated from each other. Conductive layer 21 is formed to the right of a space above insulating layer 18 in the drawing, and in contact with p-type impurity region 4. Conductive layer 22 is formed to the left of the space above insulating layer 18 in the drawing, and in contact with p-type impurity region 6. Conductive layer 30 is formed on an underside of substrate S1 in the drawing.

Referring to FIGS. 1 to 3, in semiconductor device 50, n-type impurity region 1 serves as a cathode region of diode D1 (a first cathode region) and a cathode region of diode D2 (a second cathode region). P-type impurity region 4 serves as an anode region of diode D1 (a first anode region), and p-type impurity region 6 serves as an anode region of diode D2 (a second anode region). Conductive layer 21 serves as anode A1 of diode D1, conductive layer 22 serves as anode A2 of diode D2, and conductive layer 30 serves in common as cathode K1 of diode D1 and cathode K2 of diode D2. Further, although not shown, conductive layer 22 is electrically connected with emitter E of transistor T, and conductive layer 30 is electrically connected with collector C of transistor T.

It is to be noted that an "anode region" refers to an impurity region serving as an anode of a diode, and a "cathode region" refers to an impurity region serving as a cathode of a diode.

Semiconductor device 50 in the present embodiment includes transistor T, diode D1, and diode D2. Collector C of transistor T and cathode K1 of diode D1 are electrically connected. Collector C of transistor T and cathode K2 of diode D2 are electrically connected, and emitter E of transistor T and anode A2 of diode D2 are electrically connected. Diodes D1 and D2 are formed in identical substrate S1.

According to semiconductor device 50 in the present embodiment, since diodes D1 and D2 are formed in identical substrate S1, the number of substrates can be reduced compared to the case where diodes D1 and D2 are formed in separate substrates. Consequently, space occupied by the substrate can be reduced, and thus the semiconductor device can be produced in a smaller size. Further, two diodes D1 and D2 can be produced at one time, and thus the semiconductor device can be produced in less steps.

Furthermore, in semiconductor device 50, diode D1 has p-type impurity region 4 and n-type impurity region 1 within substrate S1, and diode D2 has p-type impurity region 6 and n-type impurity region 1 within substrate S1. Each cathode region of diodes D1 and D2 is formed by n-type impurity region 1.

Thereby, diodes D1 and D2 have a common cathode region, and thus the semiconductor device can be produced in a smaller size and in less steps.

Further, in semiconductor device 50, p-type impurity regions 4 and 6 are separated from each other, and both are formed within n-type impurity region 1 in the upper surface of substrate S1.

Thereby, anode A1 of diode D1 and anode A2 of diode D2 can be formed on the upper surface of substrate S1.

Further, in semiconductor device 50, p-type impurity regions 4 and 6 are separated from each other with only n-type impurity region 1 interposed therebetween.

Thereby, a distance between anode A1 of diode D1 and anode A2 of diode D2 as seen in plane is reduced, and thus the semiconductor device can be produced in a smaller size.

Second Embodiment

Figure 4:
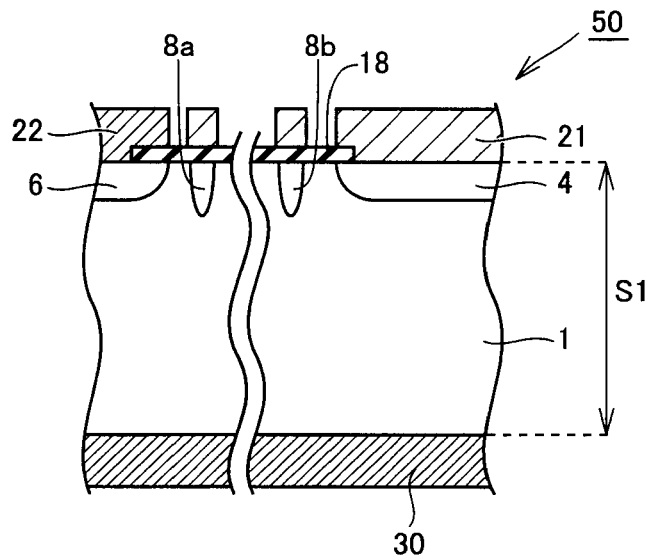
FIG. 4 is a cross sectional view showing a structure of a semiconductor device in a second embodiment of the present invention.

Referring to FIG. 4, in semiconductor device 50 in the present embodiment, a plurality of p-type impurity regions 8a and 8b (another impurity region) are each formed within n-type impurity region 1 between p-type impurity region 4 and p-type impurity region 6. The plurality of p-type impurity regions 8a and 8b are each formed in the upper surface of substrate S1.

Since the structure and the circuit of semiconductor device 50 other than the above are the same as those of the semiconductor device in the first embodiment shown in FIGS. 1 to 3, identical parts will be designated by the same reference characters, and descriptions thereof will not be repeated.

Semiconductor device 50 in the present embodiment further includes the plurality of p-type impurity regions 8a and 8b formed within n-type impurity region 1 between p-type impurity region 4 and p-type impurity region 6.

According to semiconductor device 50 in the present embodiment, the same effect as that of the semiconductor device in the first embodiment can be obtained. In addition, p-type impurity regions 8a and 8b serve as a guard ring. Specifically, when a reverse voltage is applied, a depletion layer spreads from a boundary between n-type impurity region 1 and each of p-type impurity regions 8a and 8b into n-type impurity region 1. Consequently, this depletion layer can suppress an electric field from concentrating on a boundary between n-type impurity region 1 and each of p-type impurity regions 4 and 6. Thereby, semiconductor device 50 can have an improved withstanding voltage.

It is to be noted that any number of p-type impurity regions 8a and 8b may be formed between p-type impurity region 4 and p-type impurity region 6: one p-type impurity region may be formed, and more than two p-type impurity regions may be formed.

Third Embodiment

Figure 5:
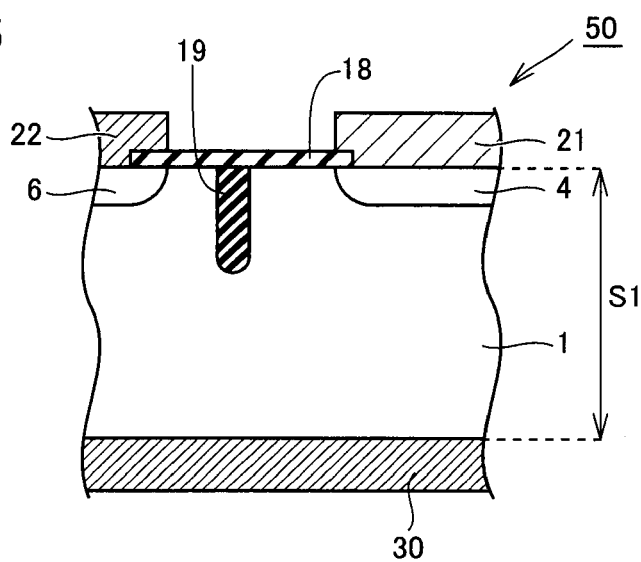
FIG. 5 is a cross sectional view showing a structure of a semiconductor device in a third embodiment of the present invention.

Referring to FIG. 5, in semiconductor device 50 in the present embodiment, an insulating layer 19 (a trench) is formed within n-type impurity region 1 between p-type impurity region 4 and p-type impurity region 6. Insulating layer 19 extends from insulating layer 18 downward in the drawing. Insulating layers 18 and 19 may be formed integrally.

Since the structure and the circuit of semiconductor device 50 other than the above are the same as those of the semiconductor device in the first embodiment shown in FIGS. 1 to 3, identical parts will be designated by the same reference characters, and descriptions thereof will not be repeated.

Semiconductor device 50 in the present embodiment further includes insulating layer 19 formed within n-type impurity region 1 between p-type impurity region 4 and p-type impurity region 6.

According to semiconductor device 50 in the present embodiment, the same effect as that of the semiconductor device in the first embodiment can be obtained. In addition, since a current path between p-type impurity region 4 and p-type impurity region 6 is lengthened, punch-through between p-type impurity region 4 and p-type impurity region 6 can be suppressed. Thereby, semiconductor device 50 can have an improved withstanding voltage.

Fourth Embodiment

Figure 6:
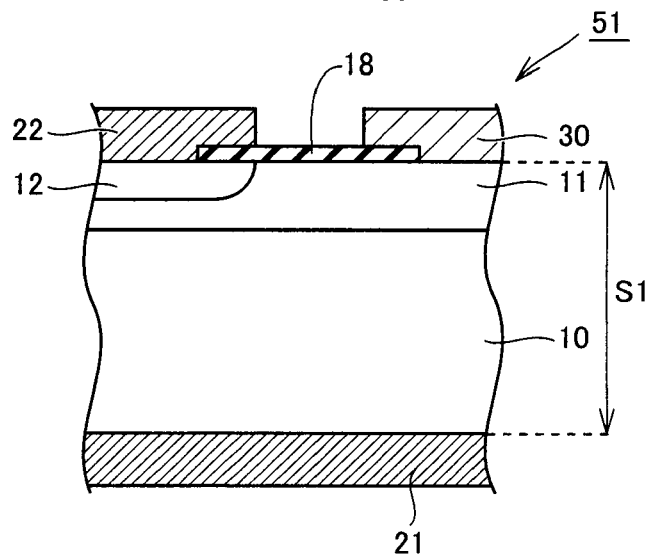
FIG. 6 is a cross sectional view showing a structure of a semiconductor device in a fourth embodiment of the present invention.

Referring to FIG. 6, a semiconductor device 51 in the present embodiment differs from the semiconductor device in the first embodiment shown in FIG. 3 in the structure within substrate S1.

Semiconductor device 51 has a p-type impurity region 10, an n-type impurity region 11 (one impurity region), a p-type impurity region 12, conductive layers 21 and 22, conductive layer 30, and insulating layer 18. P-type impurity region 10 is formed in an lower surface of substrate S1, and n-type impurity region 11 is formed on p-type impurity region 10. P-type impurity region 12 is formed within n-type impurity region 11 in the upper surface of substrate S1. Insulating layer 18 is formed on the upper surface of substrate S1, and conductive layers 22 and 30 are formed to cover a portion of insulating layer 18. Conductive layers 22 and 30 are separated from each other. Conductive layer 22 is formed to the left of a space above insulating layer 18 in the drawing, and in contact with p-type impurity region 12. Conductive layer 30 is formed to the right of the space above insulating layer 18 in the drawing, and in contact with n-type impurity region 11. Conductive layer 21 is formed on the underside of substrate S1 in the drawing.

Referring to FIGS. 1, 2, and 6, in semiconductor device 51, n-type impurity region 11 serves as the cathode region of diode D1 (the first cathode region) and the cathode region of diode D2 (the second cathode region). P-type impurity region 10 serves as the anode region of diode D1 (the first anode region), and p-type impurity region 12 serves as the anode region of diode D2 (the second anode region). Conductive layer 21 serves as anode A1 of diode D1, conductive layer 22 serves as anode A2 of diode D2, and conductive layer 30 serves in common as cathode K1of diode D1 and cathode K2 of diode D2. Further, although not shown, conductive layer 22 is electrically connected with emitter E of transistor T, and conductive layer 30 is electrically connected with collector C of transistor T.

It is to be noted that the circuit and the structure on the upper surface of semiconductor device 51 are the same as those of the semiconductor device in the first embodiment shown in FIGS. 1 and 2.

In semiconductor device 51 in the present embodiment, p-type impurity region 10 is formed in the lower surface of substrate S1, and p-type impurity region 12 is formed in the upper surface of substrate S1.

According to semiconductor device 51 in the present embodiment, the same effect as that of the semiconductor device in the first embodiment can be obtained. In addition, anode A1 of diode D1 can be formed on the lower surface of substrate S1 and anode A2 of diode D2 can be formed on the upper surface of substrate S1.

Fifth Embodiment

Figure 7:
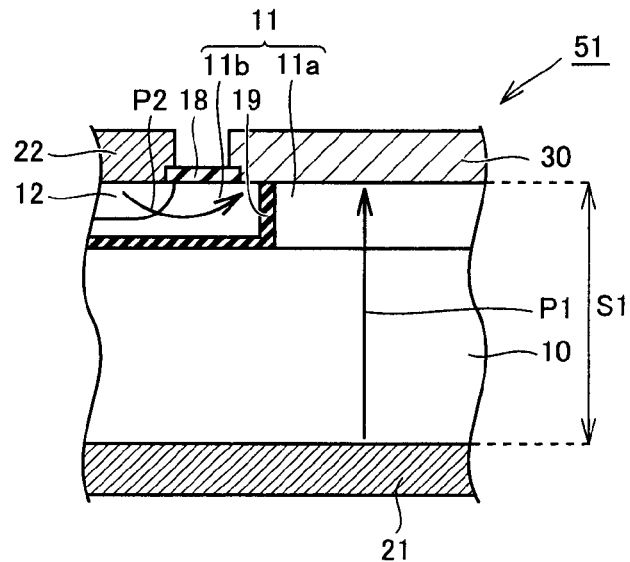
FIG. 7 is a cross sectional view showing a structure of a semiconductor device in a fifth embodiment of the present invention.

Referring to FIG. 7, semiconductor device 51 in the present embodiment further includes insulating layer 19. Insulating layer 19 is formed between p-type impurity region 10 and n-type impurity region 11, and extends upward in the drawing directly under conductive layer 30 to establish contact with conductive layer 30. N-type impurity region 11 is electrically separated into n-type impurity regions 11a and 11b by insulating layer 19. Specifically, a current path P1 of diode D1 from conductive layer 21 to conductive layer 30 and a current path P2 of diode D2 from conductive layer 22 to conductive layer 30 are electrically separated.

Since the structure and the circuit of semiconductor device 51 other than the above are the same as those of the semiconductor device in the fourth embodiment shown in FIG. 6, identical parts will be designated by the same reference characters, and descriptions thereof will not be repeated.

Semiconductor device 51 in the present embodiment further includes conductive layer 30 formed on the upper surface of substrate S1 to be in contact with n-type impurity region 11, conductive layer 21 formed on the underside of substrate S1 to be in contact with p-type impurity region 10, and conductive layer 22 formed on the upper surface of substrate S1 to be in contact with p-type impurity region 12. Current path P1 of diode D1 from conductive layer 21 to conductive layer 30 and current path P2 of diode D2 from conductive layer 22 to conductive layer 30 are electrically separated.

According to semiconductor device 51 in the present embodiment, the same effect as that of the semiconductor device in the fourth embodiment can be obtained. In addition, punch-through between p-type impurity region 10 and p-type impurity region 12 can be suppressed, and thus semiconductor device 51 can have an improved withstanding voltage.

Sixth Embodiment

Figure 8:
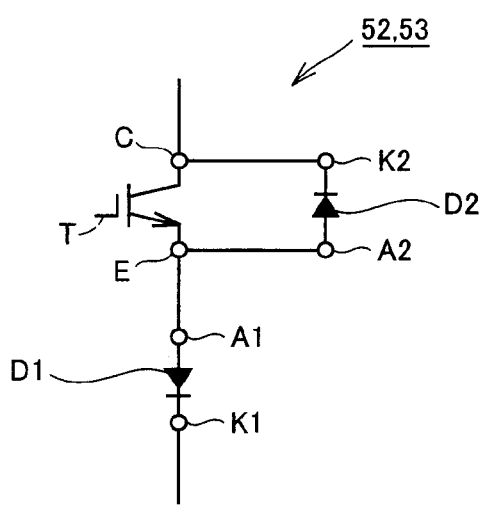
FIG. 8 is a circuit diagram of a semiconductor device in a sixth embodiment of the present invention.

Referring to FIG. 8, a circuit of a semiconductor device 52 in the present embodiment differs from that of the semiconductor devices in the first to fifth embodiments shown in FIG. 1 in the position where diode D1 is connected. Specifically, anode A1 of diode D1 is electrically connected to emitter E of transistor T, and cathode K1 of diode D1 is not electrically connected to collector C of transistor T.

Figure 9:
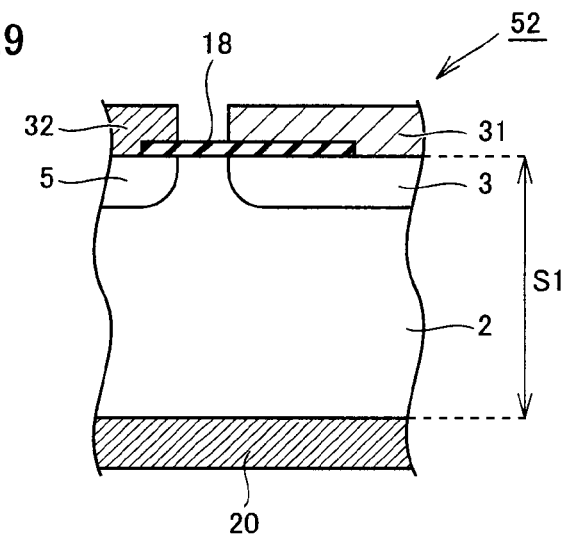
FIG. 9 is a cross sectional view showing a structure of the semiconductor device in the sixth embodiment of the present invention.

Referring to FIG. 9, semiconductor device 52 has a p-type impurity region 2 (one impurity region), n-type impurity regions 3 and 5, conductive layers 31 and 32, a conductive layer 20, and insulating layer 18. P-type impurity region 2 is formed within substrate S1, and n-type impurity regions 3 and 5 are formed within p-type impurity region 2 in the upper surface of substrate S1. N-type impurity regions 3 and 5 are separated from each other with only p-type impurity region 2 interposed therebetween. Insulating layer 18 is formed on the upper surface of substrate S1, and conductive layers 31 and 32 are formed to cover a portion of insulating layer 18. Conductive layers 31 and 32 are separated from each other. Conductive layer 31 is formed to the right of a space above insulating layer 18 in the drawing, and in contact with n-type impurity region 3. Conductive layer 32 is formed to the left of the space above insulating layer 18 in the drawing, and in contact with n-type impurity region 5. Conductive layer 20 is formed on the underside of substrate S1 in the drawing.

It is to be noted that the structure on the upper surface of semiconductor device 52 is the same as that of the semiconductor device in the first embodiment shown in FIG. 2.

Referring to FIGS. 1, 2, and 9, in semiconductor device 52, p-type impurity region 2 serves as the anode region of diode D1 (the first anode region) and the anode region of diode D2 (the second anode region). N-type impurity region 3 serves as the cathode region of diode D1 (the first cathode region), and n-type impurity region 5 serves as the cathode region of diode D2 (the second cathode region). Conductive layer 31 serves as cathode K1 of diode D1, conductive layer 32 serves as cathode K2 of diode D2, and conductive layer 20 serves in common as anode A1 of diode D1 and anode A2 of diode D2. Further, although not shown, conductive layer 32 is electrically connected with collector C of transistor T, and conductive layer 20 is electrically connected with emitter E of transistor T.

Semiconductor device 52 in the present embodiment includes transistor T, diode D1, and diode D2. Emitter E of transistor T and anode A1 of diode D1 are electrically connected. Collector C of transistor T and cathode K2 of diode D2 are electrically connected, and emitter E of transistor T and anode A2 of diode D2 are electrically connected. Diodes D1 and D2 are formed in identical substrate S1.

According to semiconductor device 52 in the present embodiment, the same effect as that of semiconductor device 50 in the first embodiment can be obtained.

Further, in semiconductor device 52, diode D1 has p-type impurity region 2 and n-type impurity region 3 within substrate S1, and diode D2 has p-type impurity region 2 and n-type impurity region 5 within substrate S1. Each anode region of diodes D1 and D2 is formed by p-type impurity region 2.

Thereby, diodes D1 and D2 have a common anode region, and thus the semiconductor device can be produced in a smaller size and in less steps.

Further, in semiconductor device 52, n-type impurity regions 3 and 5 are separated from each other, and both are formed within p-type impurity region 2 in the upper surface of substrate S1.

Thereby, cathode K1 of diode D1 and cathode K2 of diode D2 can be formed on the upper surface of substrate S1.

Further, in semiconductor device 52, n-type impurity regions 3 and 5 are separated from each other with only p-type impurity region 2 interposed therebetween.

Thereby, a distance between cathode K1 of diode D1 and cathode K2 of diode D2 as seen in plane is reduced, and thus the semiconductor device can be produced in a smaller size.

Seventh Embodiment

Figure 10:
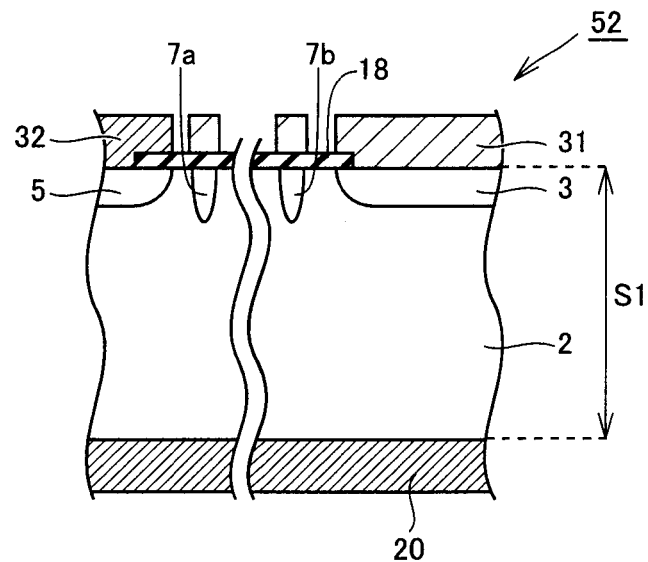
FIG. 10 is a cross sectional view showing a structure of a semiconductor device in a seventh embodiment of the present invention.

Referring to FIG. 10, in semiconductor device 52 in the present embodiment, a plurality of n-type impurity regions 7a and 7b (another impurity region) are each formed within p-type impurity region 2 between n-type impurity region 3 and n-type impurity region 5. The plurality of n-type impurity regions 7a and 7b are each formed in the upper surface of substrate S1.

Since the structure and the circuit of semiconductor device 52 other than the above are the same as those of the semiconductor device in the sixth embodiment shown in FIGS. 8 and 9, identical parts will be designated by the same reference characters, and descriptions thereof will not be repeated.

Semiconductor device 52 in the present embodiment further includes the plurality of n-type impurity regions 7a and 7b formed within p-type impurity region 2 between n-type impurity region 3 and n-type impurity region 5.

According to semiconductor device 52 in the present embodiment, the same effect as that of the semiconductor device in the sixth embodiment can be obtained. In addition, n-type impurity regions 7a and 7b serve as a guard ring. Specifically, when a reverse voltage is applied, a depletion layer spreads from a boundary between p-type impurity region 2 and each of n-type impurity regions 7a and 7b into p-type impurity region 2. Consequently, this depletion layer can suppress an electric field from concentrating on a boundary between p-type impurity region 2 and each of n-type impurity regions 3 and 5. Thereby, semiconductor device 52 can have an improved withstanding voltage.

It is to be noted that any number of n-type impurity regions 7a and 7b may be formed between n-type impurity region 3 and n-type impurity region 5: one n-type impurity region may be formed, and more than two n-type impurity regions may be formed.

Eighth Embodiment

Figure 11:
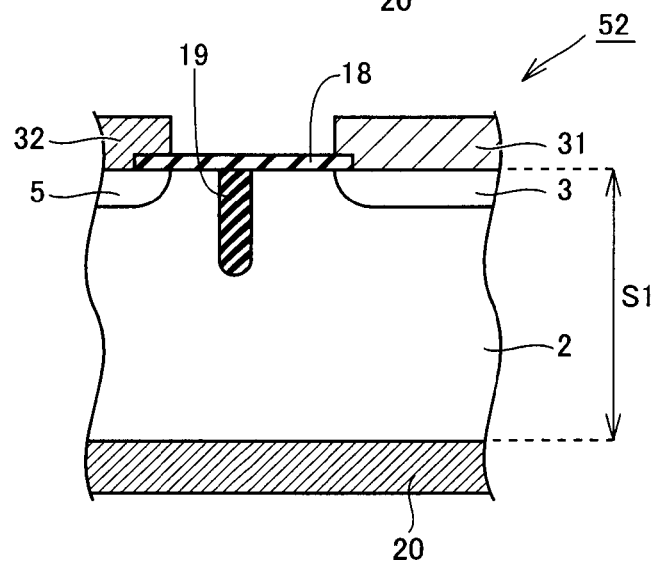
FIG. 11 is a cross sectional view showing a structure of a semiconductor device in an eighth embodiment of the present invention.

Referring to FIG. 11, in semiconductor device 52 in the present embodiment, insulating layer 19 (trench) is formed within p-type impurity region 2 between n-type impurity region 3 and n-type impurity region 5. Insulating layer 19 extends from insulating layer 18 downward in the drawing. Insulating layers 18 and 19 may be formed integrally.

Since the structure and the circuit of semiconductor device 52 other than the above are the same as those of the semiconductor device in the sixth embodiment shown in FIGS. 8 and 9, identical parts will be designated by the same reference characters, and descriptions thereof will not be repeated.

Semiconductor device 52 in the present embodiment further includes insulating layer 19 formed within p-type impurity region 2 between n-type impurity region 3 and n-type impurity region 5.

According to semiconductor device 52 in the present embodiment, the same effect as that of the semiconductor device in the sixth embodiment can be obtained. In addition, since a current path between n-type impurity region 3 and n-type impurity region 5 is lengthened, punch-through between n-type impurity region 3 and n-type impurity region 5 can be suppressed. Thereby, semiconductor device 52 can have an improved withstanding voltage.

Ninth Embodiment

Figure 12:
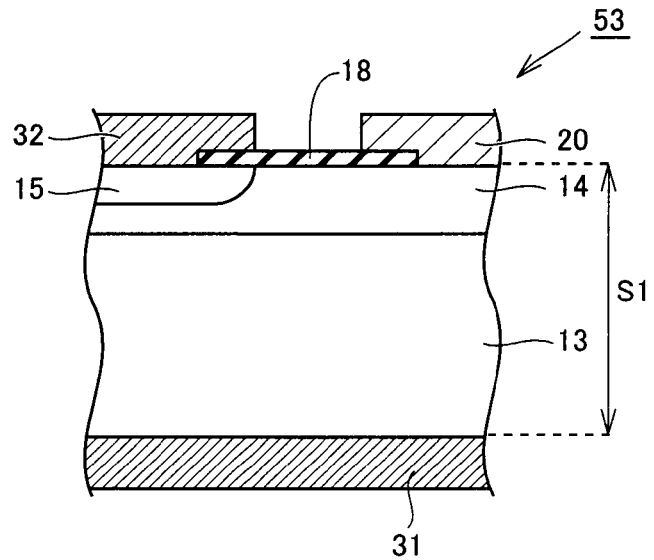
FIG. 12 is a cross sectional view showing a structure of a semiconductor device in a ninth embodiment of the present invention.

Referring to FIG. 12, a semiconductor device 53 in the present embodiment differs from the semiconductor device in the sixth embodiment shown in FIG. 9 in the structure within substrate S1. Semiconductor device 53 includes an n-type impurity region 13, a p-type impurity region 14 (one impurity region), an n-type impurity region 15, conductive layer 20, conductive layers 31 and 32, and insulating layer 18. N-type impurity region 13 is formed in the lower surface of substrate S1, and p-type impurity region 14 is formed on n-type impurity region 13. N-type impurity region 15 is formed within p-type impurity region 14 in the upper surface of substrate S1. Insulating layer 18 is formed on the upper surface of substrate S1, and conductive layers 20 and 32 are formed to cover a portion of insulating layer 18. Conductive layers 20 and 32 are separated from each other. Conductive layer 20 is formed to the right of a space above insulating layer 18 in the drawing, and in contact with p-type impurity region 14. Conductive layer 32 is formed to the left of the space above insulating layer 18 in the drawing, and in contact with n-type impurity region 15. Conductive layer 31 is formed on the underside of substrate S1 in the drawing. When seen from the upper surface, semiconductor device 53 has the same structure as that of the semiconductor device in the first embodiment shown in FIG. 2.

Referring to FIGS. 2, 8, and 12, in semiconductor device 53, p-type impurity region 14 serves as the anode region of diode D1 (the first anode region) and the anode region of diode D2 (the second anode region). N-type impurity region 13 serves as the cathode region of diode D1 (the first cathode region), and n-type impurity region 15 serves as the cathode region of diode D2 (the second cathode region). Conductive layer 31 serves as cathode K1 of diode D1, conductive layer 32 serves as cathode K2 of diode D2, and conductive layer 20 serves in common as anode A1 of diode D1 and anode A2 of diode D2. Further, although not shown, conductive layer 32 is electrically connected with collector C of transistor T, and conductive layer 20 is electrically connected with emitter E of transistor T.

It is to be noted that the circuit of semiconductor device 53 is the same as that of the semiconductor device in the sixth embodiment shown in FIG. 8, and the structure on the upper surface of semiconductor device 53 is the same as that of the semiconductor device in the first embodiment shown in FIG. 2.

In semiconductor device 53 in the present embodiment, n-type impurity region 13 is formed in the lower surface of substrate S1, and n-type impurity region 15 is formed in the upper surface of substrate S1.

According to semiconductor device 53 in the present embodiment, the same effect as that of the semiconductor device in the first embodiment can be obtained. In addition, cathode K1 of diode D1 can be formed on the lower surface of substrate S1 and cathode K2 of diode D2 can be formed on the upper surface of substrate S1.

Tenth Embodiment

Figure 13:
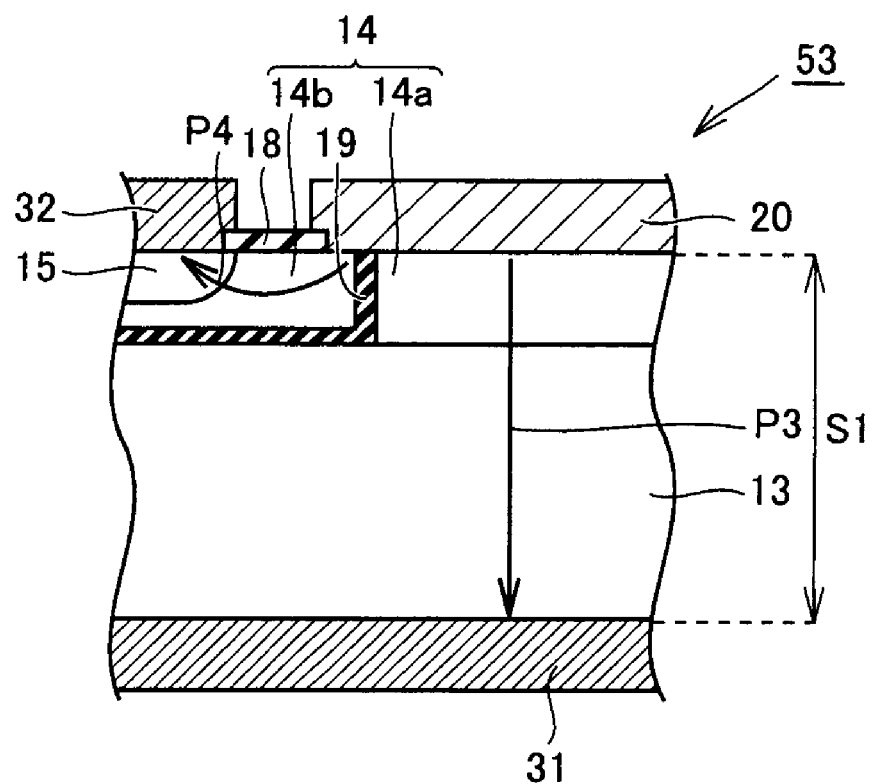
FIG. 13 is a cross sectional view showing a structure of a semiconductor device in a tenth embodiment of the present invention.

Referring to FIG. 13, semiconductor device 53 in the present embodiment further includes insulating layer 19. Insulating layer 19 is formed between n-type impurity region 13 and p-type impurity region 14, and extends upward in the drawing directly under conductive layer 20 to establish contact with conductive layer 20. P-type impurity region 14 is electrically separated into p-type impurity regions 14a and 14b by insulating layer 19. Specifically, a current path P3 of diode D1 from conductive layer 20 to conductive layer 31 and a current path P4 of diode D2 from conductive layer 20 to conductive layer 32 are electrically separated.

Since the structure and the circuit of semiconductor device 53 other than the above are the same as those of the semiconductor device in the ninth embodiment shown in FIG. 12, identical parts will be designated by the same reference characters, and descriptions thereof will not be repeated.

Semiconductor device 53 in the present embodiment further includes conductive layer 20 formed on the upper surface of substrate S1 to be in contact with p-type impurity region 14, conductive layer 31 formed on the underside of substrate S1 to be in contact with n-type impurity region 13, and conductive layer 32 formed on the upper surface of substrate S1 to be in contact with n-type impurity region 15. Current path P3 of diode D1 from conductive layer 20 to conductive layer 31 and current path P4 of diode D2 from conductive layer 20 to conductive layer 32 are electrically separated.

According to semiconductor device 53 in the present embodiment, the same effect as that of the semiconductor device in the ninth embodiment can be obtained. In addition, punch-through between n-type impurity region 13 and n-type impurity region 15 can be suppressed, and thus semiconductor device 53 can have an improved withstanding voltage.

It is to be noted that lifetime control may be performed in either one or both of diodes D1 and D2 shown in the first to tenth embodiments. Thereby, recovery loss of the diode can be reduced.

The present invention is suitable as a power semiconductor device. In particular, the present invention is suitable as a structure for protecting a switching element of a current-source inverter.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    a switching element;
    a first diode comprising a reverse blocking diode connected in series with respect to said switching element to prevent reverse voltage from being applied to said switching element; and
    a second diode,
    wherein a collector of said switching element and a cathode of said first diode are electrically connected, or an emitter of said switching element and an anode of said first diode are electrically connected,
    said collector of said switching element and a cathode of said second diode are electrically connected, and said emitter of said switching element and an anode of said second diode are electrically connected, and said first diode and said second diode are formed in an identical substrate.

2. A semiconductor device, comprising:
a switching element;
a first diode connected in series with respect to said switching element; and
a second diode,
wherein a collector of said switching element and a cathode of said first diode are electrically connected, or an emitter of said switching element and an anode of said first diode are electrically connected,
said collector of said switching element and a cathode of said second diode are electrically connected, and said emitter of said switching element and an anode of said second diode are electrically connected, and
said first diode and said second diode are formed in an identical substrate,
wherein said first diode has a first anode region and a first cathode region within said substrate, said second diode has a second anode region and a second cathode region within said substrate, and said first and second cathode regions are formed by one impurity region.

3. The semiconductor device according to claim 2, wherein said first and second anode regions are separated from each other, and both are formed within said one impurity region in one main surface of said substrate.

4. The semiconductor device according to claim 3, wherein said first anode region and said second anode region are separated from each other with only said one impurity region interposed therebetween.

5. The semiconductor device according to claim 3, further comprising another impurity region formed within said one impurity region between said first anode region and said second anode region and having a conductive type different from that of said one impurity region.

6. The semiconductor device according to claim 3, further comprising an insulating layer formed within said one impurity region between said first anode region and said second anode region.

7. The semiconductor device according to claim 2, wherein said second anode region is formed in one main surface of said substrate, and said first anode region is formed in the other main surface of said substrate.

8. The semiconductor device according to claim 7, further comprising:
a cathode electrode formed on said one main surface of said substrate to be in contact with said one impurity region;
a first anode electrode formed on said other main surface of said substrate to be in contact with said first anode region; and
a second anode electrode formed on said one main surface of said substrate to be in contact with said second anode region,
wherein a current path from said first anode electrode to said cathode electrode and a current path from said second anode electrode to said cathode electrode are electrically separated.

9. A semiconductor device, comprising:
a switching element;
a first diode connected in series with respect to said switching element; and
a second diode,
wherein a collector of said switching element and a cathode of said first diode are electrically connected, or an emitter of said switching element and an anode of said first diode are electrically connected,
said collector of said switching element and a cathode of said second diode are electrically connected, and said emitter of said switching element and an anode of said second diode are electrically connected, and
said first diode and said second diode are formed in an identical substrate,
wherein said first diode has a first anode region and a first cathode region within said substrate, said second diode has a second anode region and a second cathode region within said substrate, and said first and second anode regions are formed by one impurity region.

10. The semiconductor device according to claim 9, wherein said first and second cathode regions are separated from each other, and both are formed within said one impurity region in one main surface of said substrate.

11. The semiconductor device according to claim 10, wherein said first cathode region and said second cathode region are separated with each other with only said one impurity region interposed therebetween.

12. The semiconductor device according to claim 10, further comprising another impurity region formed within said one impurity region between said first cathode region and said second cathode region and having a conductive type different from that of said one impurity region.

13. The semiconductor device according to claim 10, further comprising an insulating layer formed within said one impurity region between said first cathode region and said second cathode region.

14. The semiconductor device according to claim 9, wherein said second cathode region is formed in one main surface of said substrate, and said first cathode region is formed in the other main surface of said substrate.

15. The semiconductor device according to claim 14, further comprising:
an anode electrode formed on said one main surface of said substrate to be in contact with said one impurity region;
a first cathode electrode formed on said other main surface of said substrate to be in contact with said first cathode region; and
a second cathode electrode formed on said one main surface of said substrate to be in contact with said second cathode region,
wherein a current path from said anode electrode to said first cathode electrode and a current path from said anode electrode to said second cathode electrode are electrically separated.

* * * * *